(12) United States Patent
Pyon et al.

(10) Patent No.: US 10,074,671 B2
(45) Date of Patent: Sep. 11, 2018

(54) DISPLAY PANEL AND A METHOD OF MANUFACTURING THE SAME

(71) Applicant: SAMSUNG DISPLAY CO., LTD., Yongin-si, Gyeonggi-Do (KR)

(72) Inventors: Chang-Soo Pyon, Seongnam-si (KR); Ju-Hee Hyeon, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/392,495

(22) Filed: Dec. 28, 2016

(65) Prior Publication Data
US 2017/0301695 A1   Oct. 19, 2017

(30) Foreign Application Priority Data
Apr. 15, 2016 (KR) .................. 10-2016-0046080

(51) Int. Cl.
| H01L 27/14 | (2006.01) |
| H01L 29/04 | (2006.01) |
| H01L 29/15 | (2006.01) |
| H01L 31/036 | (2006.01) |
| H01L 27/12 | (2006.01) |
| H01L 27/32 | (2006.01) |

(52) U.S. Cl.
CPC .......... H01L 27/124 (2013.01); H01L 27/127 (2013.01); H01L 27/1222 (2013.01); *H01L 27/3223* (2013.01); *H01L 27/3262* (2013.01); *H01L 27/3276* (2013.01)

(58) Field of Classification Search
CPC combination set(s) only.
See application file for complete search history.

(56) References Cited

U.S. PATENT DOCUMENTS

| 6,985,203 B2* | 1/2006 | Kim ............. G02F 1/1339 349/123 |
| 9,449,993 B2* | 9/2016 | Kim ............. H01L 27/124 |
| 2004/0032559 A1* | 2/2004 | Kim ............. G02F 1/1339 349/153 |
| 2016/0190166 A1* | 6/2016 | Kim ............. H01L 27/124 257/71 |

FOREIGN PATENT DOCUMENTS

| KR | 10-2015-0073744 | 7/2015 |
| KR | 10-2015-0114639 | 10/2015 |

* cited by examiner

*Primary Examiner* — Telly Green
(74) *Attorney, Agent, or Firm* — F. Chau & Associates, LLC

(57) ABSTRACT

A display panel includes a substrate including a display area, a peripheral area and a buffer area disposed between the display area and the peripheral area. The display panel further includes a switching element disposed in the display area. The switching element includes an active pattern, a gate electrode overlapping the active pattern, a source electrode connecting with the active pattern, and a drain electrode spaced apart from the source electrode. The display panel further includes a power supply line disposed in the peripheral area and disposed on a same layer as the source electrode and the drain electrode. The display panel additionally includes a power connecting line disposed in the buffer area and connecting the switching element to the power supply line. The display panel further includes a dummy active pattern disposed in the buffer area and overlapping the power connecting line.

14 Claims, 13 Drawing Sheets

DISPLAY PANEL AND A METHOD OF MANUFACTURING THE SAME

CROSS-REFERENCE TO RELATED APPLICATION

This application claims priority under 35 U.S.C. § 119 to Korean Patent Application No. 10-2016-0046080 filed on Apr. 15, 2016 in the Korean Intellectual Property Office, the disclosure of which is incorporated by reference herein in its entirety.

TECHNICAL FIELD

Exemplary embodiments of the present inventive concept relate to a display device, and more particularly, to a display panel and a method of manufacturing the display panel.

DISCUSSION OF THE RELATED ART

An organic light-emitting diode (OLED) display is a self-emissive display device provided with an OLED including a hole injection electrode, an electron injection electrode, and an organic emission layer interposed therebetween. In the OLED display, an electron injected from the electron injection electrode and a hole injected from the hole injection electrode are coupled with one another to generate an exciton. As an electron of the exciton relaxes, a photon is emitted, thereby enabling the OLED display to emit light.

The OLED display does not require an additional light source, and thus, can be made thin and light and driven with a low voltage. Furthermore, the OLED display has a wide viewing angle, high contrast, and high response speed. Due to such characteristics, the OLED display has been perceived as next-generation display apparatus.

In addition to the OLED, the OLED display includes a plurality of pixels that emit different colors to display an image.

A pixel may represent the smallest unit of an image displayed on the OLED display. Each pixel may include a gate line for driving each pixel, a data line, and a power line. An insulating layer such as a pixel defining layer for defining an area or shape of each pixel can be formed between adjacent pixels.

The OLED display may include a display area for displaying an image and a peripheral area surrounding the display area. The number of lines (e.g., gate, data, and power, etc.) included in the display area may be more than the number of lines included in the peripheral area.

In the process of forming the lines, a developer is used. However, defects may occur due to a difference in line density at a boundary of the display area and the peripheral area.

SUMMARY

According to an exemplary embodiment of the present inventive concept, a display panel includes a substrate including a display area, a peripheral area and a buffer area disposed between the display area and the peripheral area. The display panel further includes a switching element disposed in the display area. The switching element includes an active pattern, a gate electrode overlapping the active pattern, a source electrode connecting with the active pattern, and a drain electrode spaced apart from the source electrode. The display panel further includes a power supply line disposed in the peripheral area and disposed on a same layer as the source electrode and the drain electrode. The display panel additionally includes a power connecting line disposed in the buffer area and connecting the switching element to the power supply line. The display panel further includes a dummy active pattern disposed in the buffer area and overlapping the power connecting line.

In an exemplary embodiment of the present inventive concept, the display panel further includes a plurality of power connecting lines, and each power connecting line is spaced apart from an adjacent power connecting line.

In an exemplary embodiment of the present inventive concept, the power connecting line is disposed on a same layer as the source electrode and the drain electrode.

In an exemplary embodiment of the present inventive concept, the dummy active pattern is disposed on a same layer as the active pattern.

In an exemplary embodiment of the present inventive concept, the power connecting line includes a first connecting portion having a first width and a second connecting portion having a second width that is greater than the first width.

In an exemplary embodiment of the present inventive concept, the dummy active pattern includes a first dummy portion overlapping the first connecting portion and a second dummy portion overlapping the second connecting portion.

In an exemplary embodiment of the present inventive concept, the dummy active pattern includes a first dummy pattern having a first length and a second dummy pattern spaced apart from the first dummy pattern and having a second length greater than the first length.

In an exemplary embodiment of the present inventive concept, the first dummy pattern overlaps the first connecting portion, and the second dummy pattern overlaps the second connecting portion.

In an exemplary embodiment of the present inventive concept, the display panel further includes a first electrode electrically connected to the switching element, and a pixel defining layer partially overlapping with the first electrode and having an opening formed in a light-emitting region. The display panel additionally includes a light-emitting layer disposed on the first electrode corresponding to the opening, and a second electrode disposed on the pixel defining layer and the light-emitting layer.

In an exemplary embodiment of the present inventive concept, the display panel further includes a buffer layer disposed between the substrate and the active pattern.

According to an exemplary embodiment of the present inventive concept, a method of manufacturing a display panel includes forming an active pattern and a dummy active pattern on a substrate including a display area, a peripheral area surrounding the display area, and a buffer area disposed between the display area and the peripheral area. The method of manufacturing a display panel additionally includes forming a gate electrode on the active pattern and forming a source electrode, a drain electrode, a power supply line and a power connecting line on the gate electrode.

In an exemplary embodiment of the present inventive concept, the power connecting line includes a plurality of power connecting lines, and each power connecting line is spaced apart from an adjacent power connecting line.

In an exemplary embodiment of the present inventive concept, the power connecting line includes a same material as the source electrode and the drain electrode.

In an exemplary embodiment of the present inventive concept, the dummy active pattern includes a same material as the active pattern.

In an exemplary embodiment of the present inventive concept, the power connecting line includes a first connecting portion having a first width and a second connecting portion having a second width that is greater than the first width.

In an exemplary embodiment of the present inventive concept, the dummy active pattern includes a first dummy portion overlapping the first connecting portion and a second dummy portion overlapping the second connecting portion.

In an exemplary embodiment of the present inventive concept, the dummy active pattern includes a first dummy pattern having a first length and a second dummy pattern spaced apart from the first dummy pattern and having a second length greater than the first length.

In an exemplary embodiment of the present inventive concept, the first dummy pattern overlaps the first connecting portion, and the second dummy pattern overlaps the second connecting portion.

In an exemplary embodiment of the present inventive concept, the method of manufacturing the display panel further includes forming a first electrode electrically connected to the switching element and forming a pixel defining layer partially overlapping with the first electrode and having an opening formed in a light-emitting region. The method of manufacturing the display panel additionally includes forming a light-emitting layer on the first electrode and forming a second electrode on the pixel defining layer and the light-emitting layer.

In an exemplary embodiment of the present inventive concept, the display panel further includes forming a buffer layer between the substrate and the active pattern.

According to an exemplary embodiment of the present inventive concept, a display panel includes a substrate including a display area and a peripheral area, a switching element disposed in the display area, a power supply line disposed in the peripheral area. The display panel further includes a power connecting line connecting the switching element and the power supply line to one another. The power connecting line includes a first connecting portion having a first total area and a second connecting portion having a second total area that is greater than the first total area.

In an exemplary embodiment of the present inventive concept, the display further includes a dummy active pattern overlapping the power connecting line, and including a first dummy portion having a third area greater than the first total area and a second dummy portion having a fourth area greater than the second area.

In an exemplary embodiment of the present inventive concept, the substrate includes a buffer area between the display area and the peripheral area, and the dummy active pattern is disposed in the buffer area.

In an exemplary embodiment of the present inventive concept, the first dummy portion is overlapped by the first connecting portion, and the second dummy portion is overlapped by the second connecting portion.

In an exemplary embodiment of the present inventive concept, the substrate includes a buffer area between the display area and the peripheral area, and the power connecting line is disposed in the buffer area.

BRIEF DESCRIPTION OF THE DRAWINGS

Exemplary embodiments of the present inventive concept will be more clearly understood by describing in detail exemplary embodiments thereof with reference to the accompanying drawings, in which.

DETAILED DESCRIPTION OF THE EMBODIMENTS

Exemplary embodiments of the present inventive concept will be described more fully hereinafter with reference to the accompanying drawings.

Figure 1:
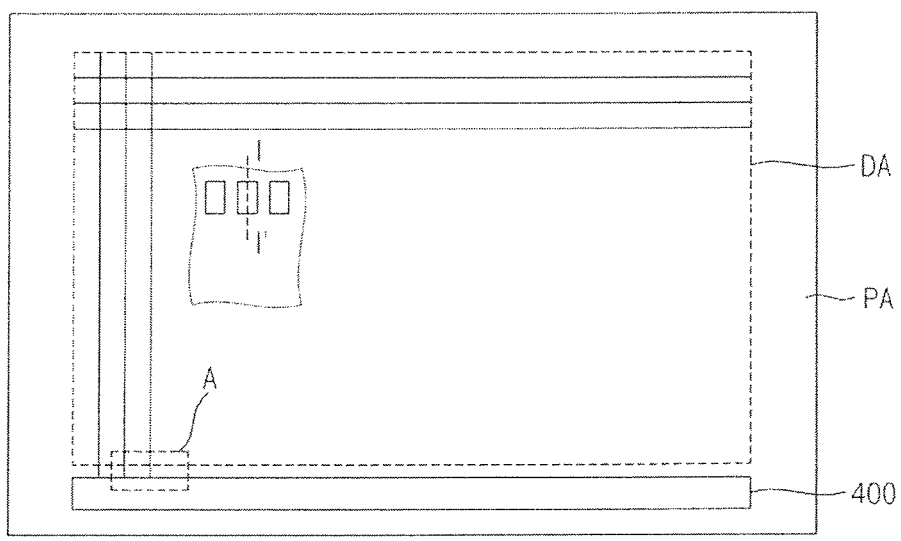
FIG. 1 is a plan view illustrating a display panel according to an exemplary embodiment of the present inventive concept.
Figure 2:
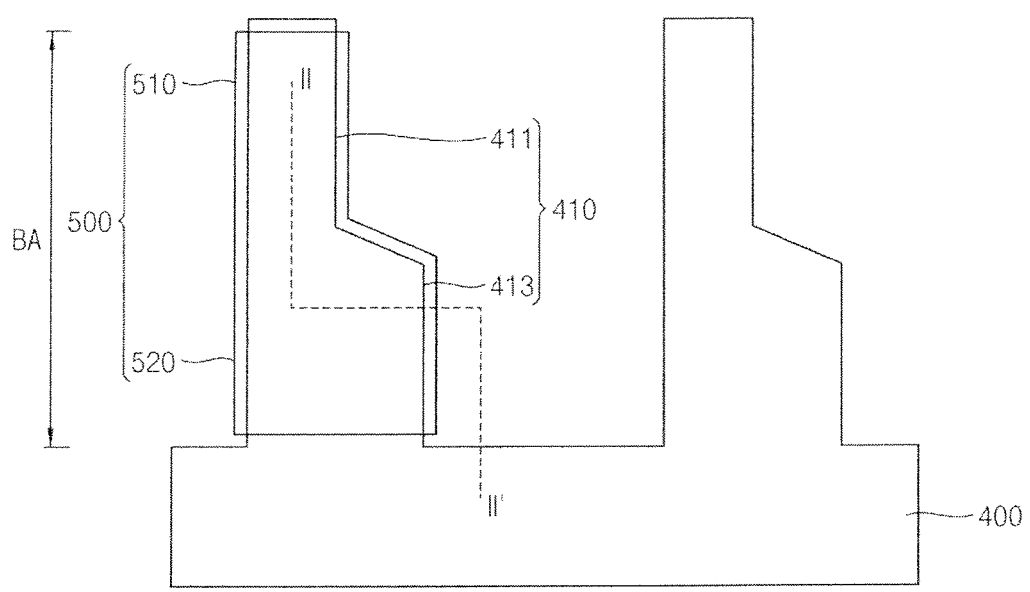
FIG. 2 is a plan view magnifying portion 'A' of FIG. 1.
Figure 3:
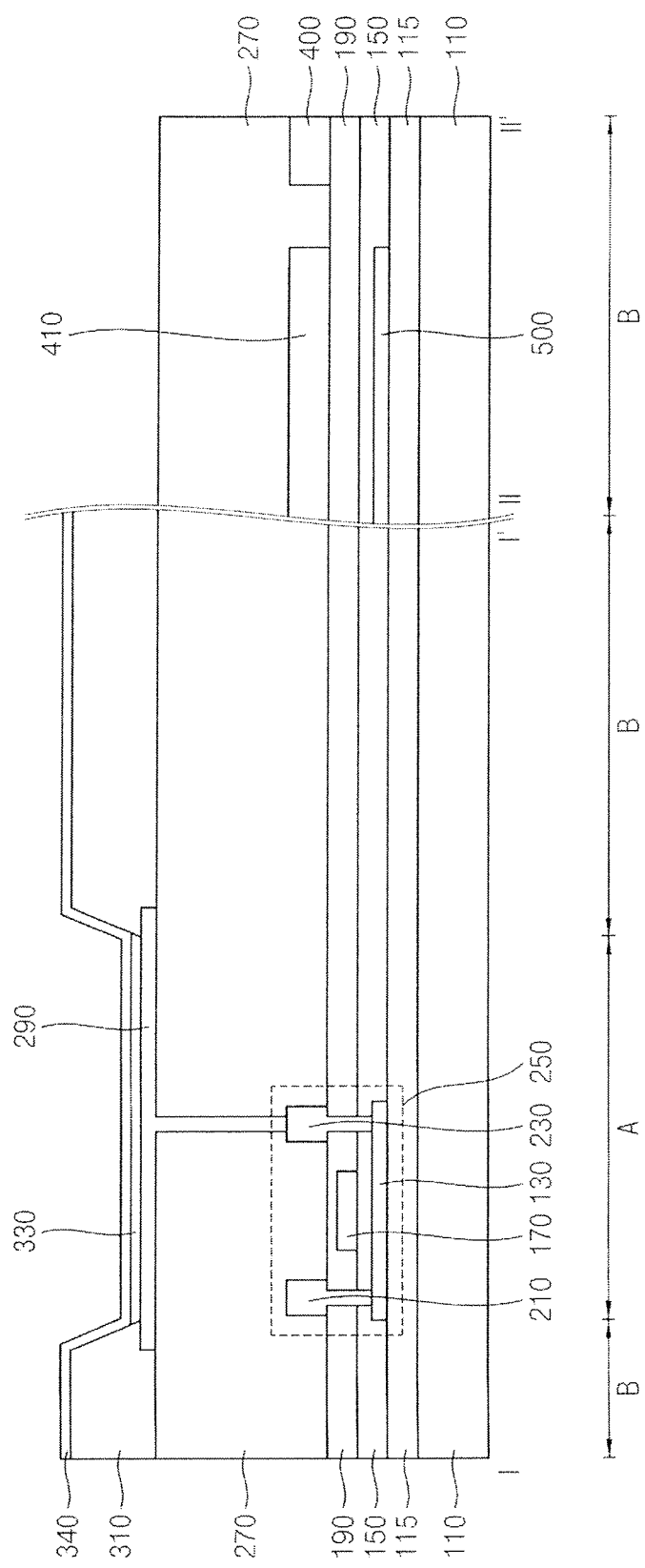
FIG. 3 is a cross-sectional view taken along line I-I' of FIG. 1 and line II-II' of FIG. 2.

FIG. 1 is a plan view illustrating a display panel according to an exemplary embodiment of the present inventive concept. FIG. 2 is a plan view magnifying portion 'A' of FIG. 1. FIG. 3 is a cross-sectional view taken along line I-I' of FIG. 1 and line II-II' of FIG. 2.

Referring to FIGS. 1, 2 and 3, a display panel according to an exemplary embodiment of the present inventive concept may include a display area DA, a peripheral area PA and a buffer area BA.

A display panel according to an exemplary embodiment of the present inventive concept may include a light-emitting region A (e.g., in FIG. 3) and a non-light-emitting region B (e.g., in FIG. 3). Pixels may be disposed in the light-emitting region A. For example, the pixel may be a pixel emitting a red color, blue color, or green color. The pixels may be disposed in the display area DA.

A display panel according to an exemplary embodiment of the present inventive concept may include a substrate 110, a buffer layer 115, a first insulation layer 150, a second insulation layer 190, a third insulation layer 270, a light-emitting structure and a pixel defining layer 310. Here, the light-emitting structure may include a switching element 250, a first electrode 290, a light-emitting layer 330 and a second electrode 340. The switching element 250 may include an active pattern 130, a gate electrode 170, a source electrode 210 and a drain electrode 230. The switching element 250 may, for example, be a type of transistor.

The light-emitting structure may be disposed on the substrate 110. The substrate 110 may include transparent materials. For example, the substrate 110 may include quartz, synthetic quartz, calcium fluoride, fluoride-doping quartz, a sodalime glass, a non-alkali glass, etc. In addition, the substrate 110 may include a flexible transparent resin substrate. Here, the flexible transparent resin substrate may include, for example, a polyimide substrate. For example, the polyimide substrate may include a first polyimide layer, a barrier film layer, a second polyimide layer, etc.

If the polyimide substrate is thin and flexible, the polyimide substrate may be disposed on a rigid glass substrate to help support the light-emitting structure. In other words, the substrate 110 may include a structure in which the first polyimide layer, the barrier film layer, and the second polyimide layer may be stacked on a glass substrate. Here, after an insulation layer is disposed on the second polyimide layer, the light-emitting structure (e.g., the switching element 250, a capacitor, the first electrode 290, the light-emitting layer 330, the second electrode 340, etc.) may be disposed on the insulation layer.

After the light-emitting structure is formed on the insulation layer, the glass substrate may be removed. Forming the light-emitting structure directly on the polyimide substrate may be difficult because the polyimide substrate is thin and flexible. Accordingly, the light-emitting structure may be formed on a rigid glass substrate. As a result, the polyimide substrate may function as the substrate 110 after the removal of the glass substrate. As the display panel includes the light-emitting region A and the non-light-emitting region B, the substrate 110 may also include the light-emitting region A and the non-light-emitting region B.

The buffer layer 115 may be disposed on the substrate 110. The buffer layer 115 may extend from the light-emitting region A into the non-light-emitting region B. The buffer layer 115 may prevent the diffusion (e.g., an out gassing) of metal atoms and/or impurities from the substrate 110. For example, the buffer layer 115 may prevent the permeation of an impure element. Additionally, the buffer layer 115 may control a rate of a heat transfer in a crystallization process for forming the active pattern 130, thereby obtaining a substantially uniform active pattern 130. Furthermore, the buffer layer 115 may flatten a surface of the substrate 110 when the surface of the substrate 110 is relatively irregular. According to a type of the substrate 110, at least two buffer layers may be disposed on the substrate 110, or the buffer layer might not be disposed on the substrate 110.

The switching element 250 may include the active pattern 130, the gate electrode 170, the source electrode 210, and the drain electrode 230. The active pattern 130 may be disposed on the substrate 110. For example, the active pattern 130 may be disposed on the buffer layer 115. The active pattern 130 may include an oxide semiconductor, an inorganic semiconductor (e.g., amorphous silicon, polysilicon, etc.), an organic semiconductor, etc.

The first insulation layer 150 may be disposed on the active pattern 130. Accordingly, the first insulation layer 150 may cover the active pattern 130 in the light-emitting region A, and may extend in a first direction (e.g., an x-axis direction) on the substrate 110. For example, the first insulation layer 150 may be disposed on the entire substrate 110. For example, the first insulation layer 150 may be disposed on the buffer layer 115. The first insulation layer 150 may include a silicon compound, a metal oxide, etc.

The gate electrode 170 may be disposed on a portion of the first insulation layer 150 under which the active pattern 130 is disposed. For example, the first insulation layer 150 may be disposed between the gate electrode 170 and the active pattern 130. The gate electrode 170 may include, for example, a metal, an alloy, a metal nitride, a conductive metal oxide, transparent conductive materials, etc. The second insulation layer 190 may be disposed on the gate electrode 170. Accordingly, the second insulation layer 190 may cover the gate electrode 170 in the light-emitting region A, and may extend in the first direction (e.g., the x-axis direction) on the substrate 110. For example, the second insulation layer 190 may be disposed on the entire substrate 110. The second insulation layer 190 may include a silicon compound, a metal oxide, etc.

The source electrode 210 and the drain electrode 230 may be disposed on the second insulation layer 190. The source electrode 210 may be in contact with a first side of the active pattern 130 by removing a portion of the first and second insulation layers 150 and 190. For example, a contact hole may be formed so that the source electrode 210 may contact the first side of the active pattern 130. The drain electrode 230 may be in contact with a second side of the active pattern 130 by removing a second portion of the first and second insulation layers 150 and 190. For example, another contact hole may be formed so that the drain electrode 230 may contact the second side of the active pattern 130. The source electrode 210 and the drain electrode 230 each may include, for example, a metal, an alloy, a metal nitride, a conductive metal oxide, transparent conductive materials, etc.

The third insulation layer 270 may be disposed on the source electrode 210 and the drain electrode 230. Accordingly, the third insulation layer 270 may cover the source electrode 210 and the drain electrode 230 in the light-emitting region A of the display panel, and may extend in the first direction (e.g., the x-axis direction) on the substrate 110. For example, the third insulation layer 270 may be disposed on the entire substrate 110. For example, the third insulation layer 270 may be disposed on the second insulation layer 190. The third insulation layer 270 may include, for example, a silicon compound, a metal oxide, etc.

The first electrode 290 may be disposed on the third insulation layer 270. The first electrode 290 may be in contact with the drain electrode 230 by removing a portion of the third insulation layer 270. For example, a contact hole may be formed so that the first electrode 290 may be in contact with the drain electrode 230. In addition, the first electrode 290 may be electrically connected to the switching element 250. The first electrode 290 may include, for example, a metal, an alloy, a metal nitride, a conductive metal oxide, transparent conductive materials, etc.

In an exemplary embodiment of the present inventive concept, the gate electrode 170 is disposed on top of the active pattern 130. However, exemplary embodiments of the present inventive concept are not limited thereto. For example, the gate electrode 170 may be disposed under the active pattern 130.

The pixel defining layer 310 may be disposed on the third insulation layer 270 such that the first electrode 290 is exposed. For example, a portion of the first electrode 290 may be covered by the third insulation layer 270. The pixel defining layer 310 may include organic materials or inorganic materials. In this case, the light-emitting layer 330 may be disposed on a portion of the first electrode 290 that is exposed by the pixel defining layer 310.

The light-emitting layer 330 may be disposed on the exposed portion of the first electrode 290. The light-emitting layer 330 may include light-emitting materials capable of generating different colors of light (e.g., red, blue and green). However, exemplary embodiments of the present inventive concept are not limited thereto. For example, the light-emitting layer 330 may stack light-emitting materials capable of generating different colors of light to emit a white color of light.

The second electrode 340 may be disposed on the pixel defining layer 310 and the light-emitting layer 330. Accordingly, the second electrode 340 may cover the pixel defining layer 310 and the light-emitting layer 330 in the light-emitting region A and the non-light-emitting region B, and the second electrode 340 may extend in the first direction (e.g., the x-axis direction) on the substrate 110. For example, the second electrode 340 may be electrically connected to a first through third pixels. The second electrode 340 may include, for example, a metal, an alloy, metal nitride, conductive metal oxide, a transparent conductive material, etc.

These materials may be used alone or in a combination thereof. The substrate 110 may be combined with a second substrate by using a sealing member. In addition, a filler may be disposed between the substrate 110 and an upper substrate (e.g., the second substrate) disposed above the substrate 110.

A power supply line 400 is disposed in the peripheral area PA. The power supply line 400 is disposed on the same layer as the source electrode 210 and the drain electrode 230. For example, the power supply line 400 may be disposed on the second insulation layer 190. The power supply line 400 may include substantially the same material as the source electrode 210 and the drain electrode 230. For example, the power supply line 400 may include a metal, an alloy, a metal nitride, a conductive metal oxide, transparent conductive materials, etc.

The buffer area BA is provided between the display area DA and the peripheral area PA. A power connecting line 410 is disposed in the buffer area BA.

The power connecting line 410 may connect the switching element 250 and the power supply line 400 to one another. In addition, there may be a plurality of power connecting lines 410. Each power connecting line 410 may be spaced apart from one another. For example, a space between the power connecting lines may be a particular distance.

The power connecting line 410 is disposed on the same layer as the source electrode 210 and the drain electrode 230. For example, the power connecting line 410 may be disposed on the second insulation layer 190. The power connecting line 410 may include substantially the same material as the source electrode 210 and the drain electrode 230. The power connecting line 410 may include, for example, a metal, an alloy, a metal nitride, a conductive metal oxide, transparent conductive materials, etc.

The power connecting line 410 may include a first connecting portion 411 having a first width and a second connecting portion 413 having a second width that is wider than the first width. However, exemplary embodiments of the present inventive concept are not limited thereto. For example, the power connecting line 410 may be one of a variety of shapes, such as a polygonal shape.

When the power supply line 400 is connected to the switching element 250 without being connected to the switching element 250 by the power connecting line 410, and since a line density of the power supply line 400 is relatively high and a line density of the switching element 250 is relatively low, a difference in line density may occur. When the power supply line 400 is formed, a lot of developer may be injected. Thus, lines of the switching element 250 adjacent to the power supply line 400 may be over developed due to the excessive amount of developer. Accordingly, patterning defects may occur in the display area DA adjacent to the power supply line 400.

However, a display panel according to an exemplary embodiment of the present inventive concept may include the power connecting line 410 that connects the power supply line 400 and the switching element 250 to one another. There may be a plurality of power connecting lines 410, and adjacent power connecting lines 410 may be spaced apart from one another. For example, a line density of the power connecting line 410 may be lower than a line density of the power supply line 400. The power connecting lines 410 may be disposed in the buffer area BA. Since the buffer area BA is disposed adjacent to the power supply line 400 having a high line density, patterning defects due to a difference in line density may occur at the power connecting line 410 of the buffer area BA. Thus, patterning defects of lines in the display area DA may decrease.

In addition, a dummy active pattern 500 is disposed in the buffer area BA. The dummy active pattern 500 overlaps the power connecting line 410. The dummy active pattern 500 may be disposed on the same layer as the active pattern 130 of the switching element 250. For example, the dummy active pattern 500 may be disposed on the first insulation layer 150. The dummy active pattern 500 may include substantially the same material as the active pattern 130. For example, the dummy active pattern 500 may include an oxide semiconductor, an inorganic semiconductor (e.g., amorphous silicon, polysilicon, etc.), an organic semiconductor, etc.

The dummy active pattern 500 may include a first dummy portion 510 overlapping the first connecting portion 411 and a second dummy portion 520 overlapping the second connecting portion 413.

When the power supply line 400 is connected to the switching element 250 without being connected to the switching element 250 by the power connecting line 410, and since a line density of the power supply line 400 is relatively high and a line density of the switching element 250 is relatively low, a difference in line density may occur. When the power supply line 400 is formed, a lot of developer may be injected. Thus, lines of the switching element 250 adjacent to the power supply line 400 may be over developed due to the excessive amount of developer. Accordingly, patterning defects may occur in the display area DA adjacent to the power supply line 400.

However, a display panel according to an exemplary embodiment of the present inventive concept includes the buffer area BA where the power supply line 400 and the switching element 250 are connected to one another. The dummy active pattern 500 is disposed in the buffer area BA. Since the buffer area BA is disposed adjacent to the power supply line 400 having a high line density, patterning defects due to a difference in line density may occur at the power connecting line 410 in the buffer area BA. Thus, patterning defects of lines in the display area DA may decrease.

FIGS. 4 to 7 are cross-sectional views illustrating a method of manufacturing the display panel of FIG. 3 according to an exemplary embodiment of the present inventive concept.

Figure 4:
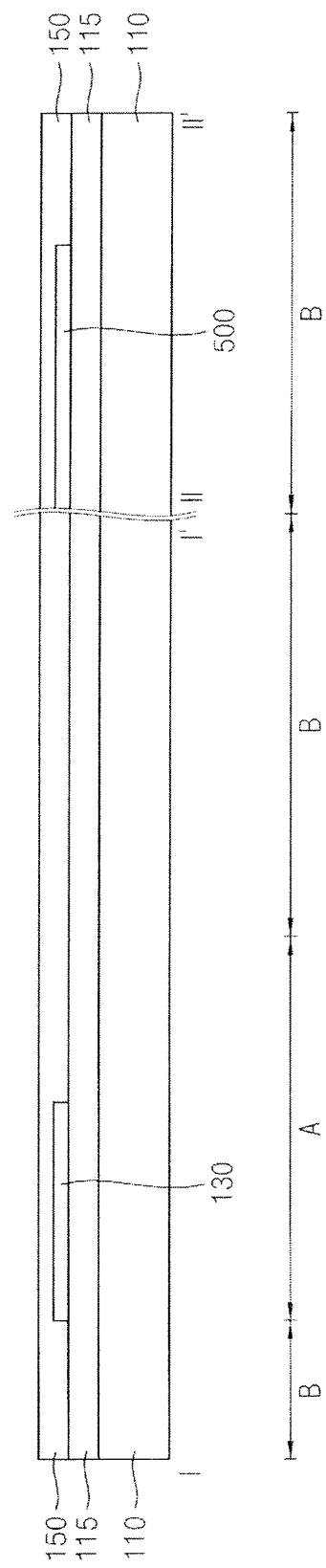
FIGS. 4, 5, 6 and 7 are cross-sectional views illustrating a method of manufacturing the display panel of FIG. 3 according to an exemplary embodiment of the present inventive concept.

Referring to FIG. 4, the buffer layer 115 is formed on the substrate 110. Further, the active pattern 130 and the first insulation layer 150 are formed on the buffer layer 115.

The substrate 110 may include, for example, quartz, synthetic quartz, calcium fluoride, fluoride-doping quartz, a sodalime glass, a non-alkali glass, etc.

The substrate 110 may include of transparent materials. For example, the substrate 110 may include quartz, synthetic quartz, calcium fluoride, fluoride-doping quartz, a sodalime glass, a non-alkali glass etc. In addition, the substrate 110 may be flexible. For example, the substrate 110 may include a flexible transparent resin substrate. Here, the flexible transparent resin substrate may include a polyimide substrate. For example, the polyimide substrate may include a first polyimide layer, a barrier film layer, a second polyimide layer, etc. If the polyimide substrate is thin and flexible, the polyimide substrate may be formed on a rigid glass substrate to help support the light-emitting structure. In other words, the substrate 110 may include a structure in which the first polyimide layer, the barrier film layer, and the second polyimide layer may be stacked on a glass substrate. Here, after an insulation layer is disposed on the second polyimide layer, the light-emitting structure (e.g., the switching element 250, a capacitor, the first electrode 290, the light-emitting layer 330, the second electrode 340, etc.) may be disposed on the insulation layer.

After the light-emitting structure is formed on the insulation layer, the glass substrate may be removed. Forming the light-emitting structure directly on the polyimide substrate may be difficult because the polyimide substrate is thin and flexible. Accordingly, the light-emitting structure may be formed on a rigid glass substrate. As a result, the polyimide substrate may function as the substrate 110 after the removal of the glass substrate. As the display panel includes the light-emitting region A and the non-light-emitting region B, the substrate 110 may also include the light-emitting region A and the non-light-emitting region B.

The buffer layer 115 may be disposed on the substrate 110. The buffer layer 115 may extend from the light-emitting region A into the non-light-emitting region B. The buffer layer 115 may prevent the diffusion (e.g., an out gassing) of metal atoms and/or other impurities from the substrate 110. For example, the buffer layer 115 may prevent the permeation of an impure element. Additionally, the buffer layer 115 may control a rate of a heat transfer in a crystallization process for forming the active pattern 130, thereby obtaining a substantially uniform active pattern 130. Furthermore, the buffer layer 115 may flatten the surface of the substrate 110 when the surface of the substrate 110 is relatively irregular. According to the type of substrate 110, at least two buffer layers may be disposed on the substrate 110, or the buffer layer might not be disposed be disposed on the substrate 110.

The active pattern 130 may include an oxide semiconductor, an inorganic semiconductor (e.g., amorphous silicon, polysilicon, etc.), an organic semiconductor, etc.

The dummy active pattern 500 may be disposed on the same layer as the active pattern 130. For example, the dummy active pattern 500 may be disposed on the first insulation layer 150. The dummy active pattern 500 may include substantially the same material as the active pattern 130. For example, the dummy active pattern 500 may include an oxide semiconductor, an inorganic semiconductor (e.g., amorphous silicon, polysilicon, etc.), an organic semiconductor, etc.

The first insulation layer 150 may be disposed on the active pattern 130 and the dummy active pattern 500. Accordingly, the first insulation layer 150 may cover the active pattern 130 in the light-emitting region A, and may extend in a first direction (e.g., the x-axis direction) on the substrate 110. For example, the first insulation layer 150 may be disposed on the entire substrate 110. For example, the first insulation layer 150 may be disposed on the buffer layer 115. The first insulation layer 150 may include a silicon compound, a metal oxide, etc.

Figure 5:
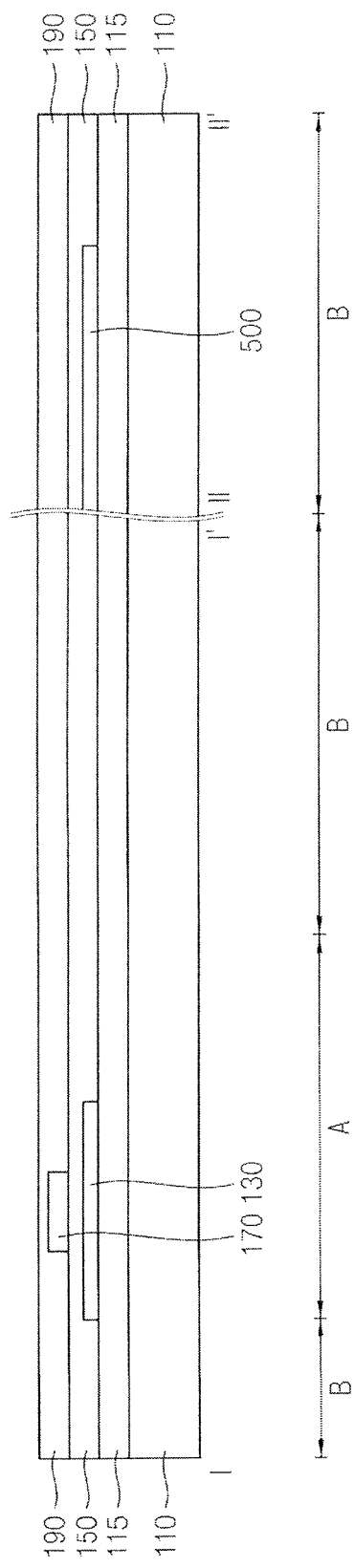

Referring to FIG. 5, the gate electrode 170 and the second insulation layer 190 may be formed on the substrate 110, which the first insulation layer 150 is formed on.

The gate electrode 170 may be disposed on a portion of the first insulation layer 150 under which the active pattern 130 is disposed. For example, the first insulation layer 150 is disposed between the gate electrode 170 and the active pattern 130. The gate electrode 170 may include a metal, an alloy, metal nitride, conductive metal oxide, transparent conductive materials, etc.

The second insulation layer 190 may be disposed on the gate electrode 170. Accordingly, the second insulation layer 190 may cover the gate electrode 170 in the light-emitting region A, and may extend in the first direction (e.g., the x-axis direction) on the substrate 110. For example, the second insulation layer 190 may extend in a horizontal direction. As an additional example, the second insulation layer 190 may be disposed on the entire substrate 110. The second insulation layer 190 may include a silicon compound, a metal oxide, etc.

Figure 6:
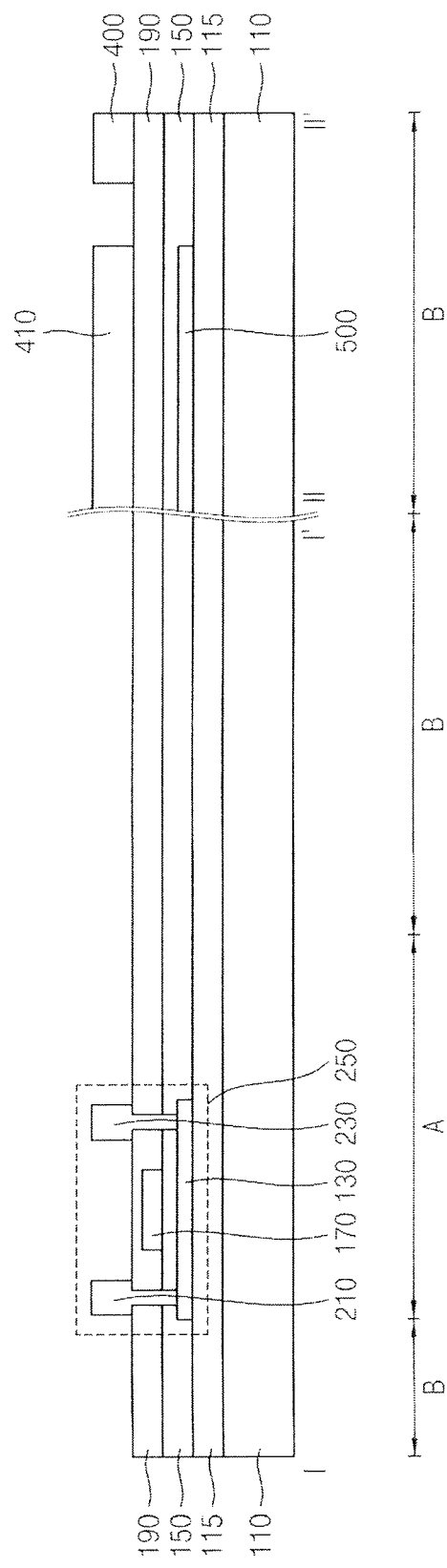

Referring to FIG. 6, the source electrode 210, the drain electrode 230, the power supply line 400 and the power connecting line 410 are formed on the substrate 110. In addition, the second insulation layer 190 is formed on the substrate 110.

The source electrode 210 and the drain electrode 230 may be disposed on the second insulation layer 190. The source electrode 210 may be in contact with a first side of the active layer 130 by removing a portion of the first and second insulation layers 150 and 190. For example, a contact hole may be formed so that the source electrode 210 may contact the first side of the active pattern 130. The drain electrode 230 may be in contact with a second side of the active layer 130 by removing a second portion of the first and second insulation layers 150 and 190. For example, another contact hole may be formed so that the drain electrode 230 may contact the second side of the active pattern 130. The source electrode 210 and the drain electrode 230 each may include, for example, a metal, an alloy, metal nitride, conductive metal oxide, transparent conductive materials, etc.

The power supply line 400 is disposed on the same layer as the source electrode 210 and the drain electrode 230. For example, the power supply line 400 may be disposed on the second insulation layer 190. The power supply line 400 may include substantially the same material as the source electrode 210 and the drain electrode 230. For example, the power supply line 400 may include a metal, an alloy, metal nitride, conductive metal oxide, transparent conductive materials, etc.

The power connecting line 410 is disposed on the same layer as the source electrode 210 and the drain electrode 230. For example, the power connecting line 410 may be disposed on the second insulation layer 190. The power connecting line 410 may include substantially the same material as the source electrode 210 and the drain electrode 230. For example, the power connecting line 410 may include a metal, an alloy, metal nitride, conductive metal oxide, transparent conductive materials, etc.

In an exemplary embodiment of the present inventive concept, the gate electrode 170 is disposed on top of the active pattern 130. For example, the gate electrode 170 may be disposed on the first insulation layer 150. However, exemplary embodiments of the present inventive concept are not limited thereto. For example, the gate electrode 170 may be disposed under the active pattern 130.

Figure 7:
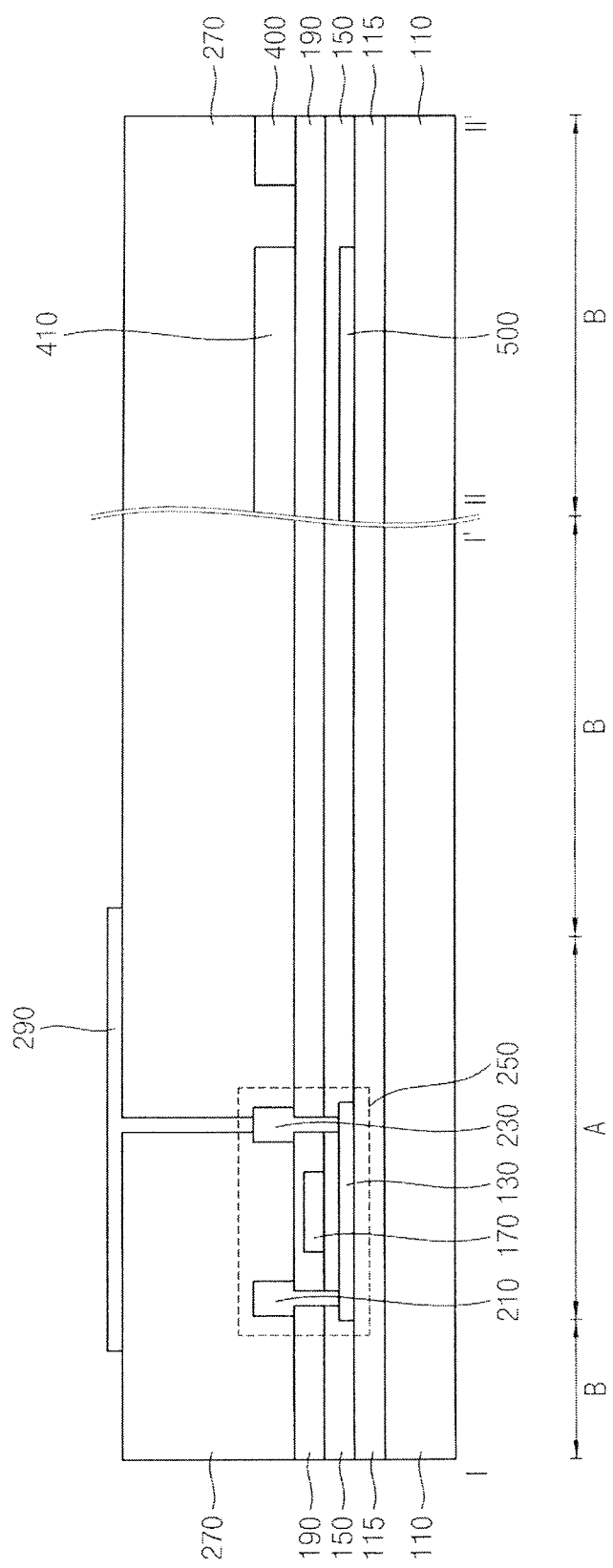

Referring to FIG. 7, the third insulation layer 270 and the first electrode 290 are formed on the substrate 110. In addition, the source electrode 210 and the drain electrode 230 are formed on the substrate 110.

The third insulation layer 270 may be disposed on the second insulation layer 190 and the source electrode 210 and the drain electrode 230. Accordingly, the third insulation layer 270 may cover the source electrode 210 and the drain electrode 230 in the light-emitting region A of the display panel, and may extend in the first direction (e.g., the x-axis direction) on the substrate 110. For example, the third insulation layer 270 may be disposed on the entire substrate 110. For example, the third insulation layer 270 may be disposed on the second insulation layer 190. The third insulation layer 270 may include, for example, a silicon compound, a metal oxide, etc.

The first electrode 290 may be disposed on the third insulation layer 270. The first electrode 290 may be in contact with the source electrode 210 by removing a portion of the third insulation layer 270. For example, a contact hole may be formed so that the first electrode 290 may be in contact with the source electrode 210. In addition, the first electrode 290 may be electrically connected to the switching element 250. The first electrode 290 may include, for example, a metal, an alloy, metal nitride, conductive metal oxide, transparent conductive materials, etc.

Referring to FIG. 3, the pixel defining layer 310, the light-emitting layer 330 and the second electrode 340 are formed on the substrate 110. In addition, the first electrode 290 is formed on the substrate 110.

The pixel defining layer 310 may be disposed the on the third insulation layer 270 such that the first electrode 290 is exposed. For example, a portion of the first electrode 290 may be covered by the pixel defining layer 1310. The pixel defining layer 310 may include organic materials or inorganic materials. In this case, the light-emitting layer 330 may be disposed on a portion of the first electrode 290 that is exposed by the pixel defining layer 310.

The light-emitting layer 330 may be disposed on the exposed portion of the first electrode 290. The light-emitting layer 330 may include light-emitting materials capable of generating different colors of light (e.g., red, blue, and green). However, exemplary embodiments of the present inventive concept are not limited thereto. For example, the light-emitting layer 330 may stack light-emitting materials capable of generating different colors of light to emit a white color of light.

The second electrode 340 may be disposed on the pixel defining layer 310 and the light-emitting layer 330. Accordingly, the second electrode 340 may cover the pixel defining layer 310 and the light-emitting layer 330 in the light-emitting region A and the non-light-emitting region B, and the second electrode 340 may extend in the first direction (e.g., the x-axis direction) on the substrate 110. For example, the second electrode 340 may be electrically connected to a first through third pixels. The second electrode 340 may include, for example, a metal, an alloy, metal nitride, conductive metal oxide, a transparent conductive material, etc. These materials may be used alone or in a combination thereof.

Figure 8:
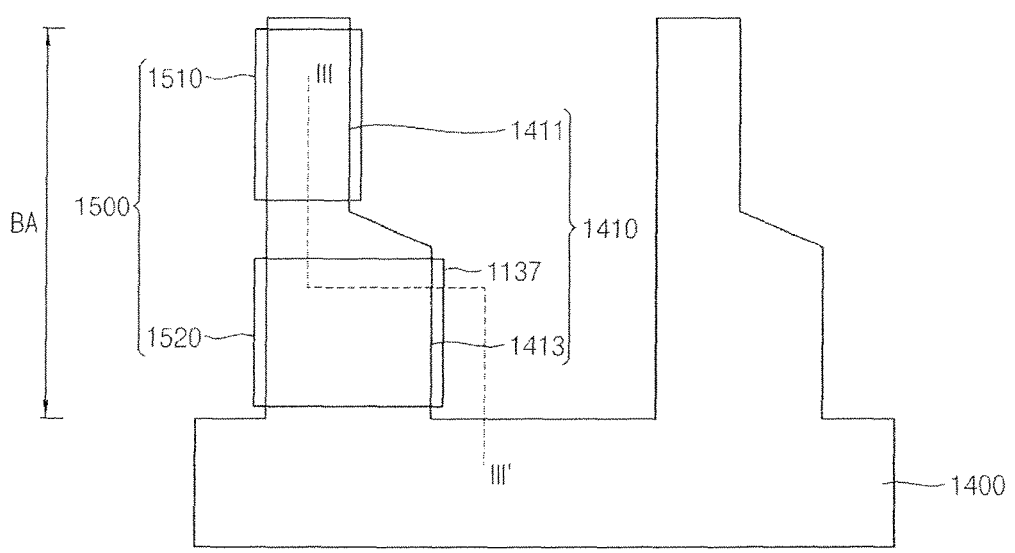
FIG. 8 is a plan view magnifying portion 'A' of FIG. 1.
Figure 9:
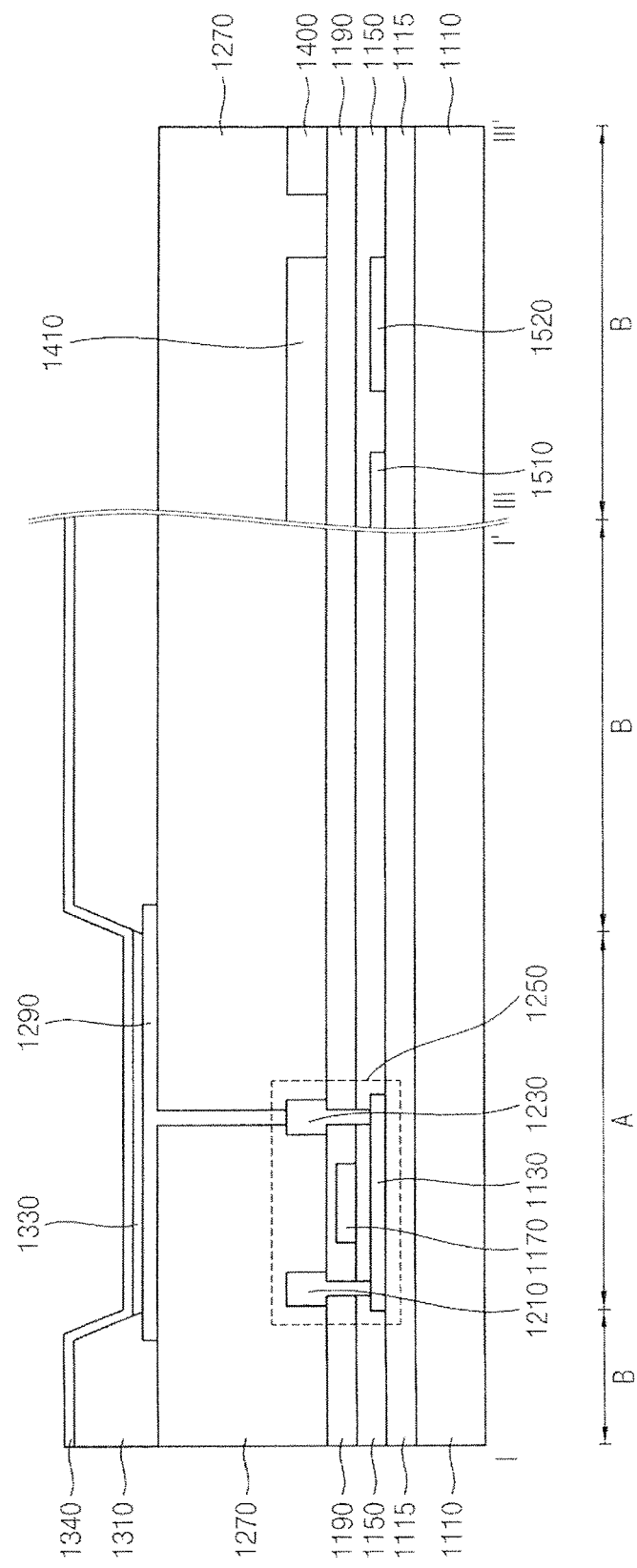
FIG. 9 is a cross-sectional view taken along line I-I' of FIG. 1 and line III-III' of FIG. 8.

FIG. 8 is a plan view magnifying portion 'A' of FIG. 1. FIG. 9 is a cross-sectional view taken along line I-I' of FIG. 1 and line III-III' of FIG. 8.

Referring to FIGS. 1 and 9, a display panel according to an exemplary embodiment of the present inventive concept may include a display area DA, a peripheral area PA and a buffer area BA.

A display panel according to an exemplary embodiment of the present inventive concept may include a light-emitting region A (e.g., in FIG. 9) and a non-light-emitting region B (e.g., in FIG. 9). Pixels may be disposed in the light-emitting region A. For example, the pixel may be a pixel emitting a red color, blue color, or green color. The pixel may be disposed in the display area DA.

A display panel according to an exemplary embodiment of the present inventive concept may include a substrate 1110, a buffer layer 1115, a first insulation layer 1150, a second insulation layer 1190, a third insulation layer 1270, a light-emitting structure and a pixel defining layer 1310. Here, the light-emitting structure may include a switching element 1250, a first electrode 1290, a light-emitting layer 1330 and a second electrode 1340. The switching element 1250 may include an active pattern 1130, a gate electrode 1170, a source electrode 1210 and a drain electrode 1230. The switching element 1250 may, for example, be a type of transistor.

The light-emitting structure may be disposed on the substrate 1110. For example, the light-emitting structure may be disposed on the third insulation layer 1270. Further, the substrate 1110 may include of transparent materials. For example, the substrate 1110 may include quartz, synthetic quartz, calcium fluoride, fluoride-doping quartz, a sodalime glass, a non-alkali glass, etc. In addition, the substrate 1110 may include a flexible transparent resin substrate. Here, the flexible transparent resin substrate may include a polyimide substrate. For example, the polyimide substrate may include a first polyimide layer, a barrier film layer, a second polyimide layer, etc.

If the polyimide substrate is thin and flexible, the polyimide substrate may be disposed on a rigid glass substrate to help support the formation of the light-emitting structure. In other words, the substrate 1110 may include a structure in which the first polyimide layer, the barrier film layer, and the second polyimide layer may be stacked on a glass substrate. Here, after an insulation layer is disposed on the second polyimide layer, the light-emitting structure (e.g., the switching element 1250, a capacitor, the first electrode 1290, the light-emitting layer 1330, the second electrode 1340, etc.) may be disposed on the insulation layer.

After the light-emitting structure is formed on the insulation layer, the glass substrate may be removed. Forming the light-emitting structure directly on the polyimide substrate may be difficult because the polyimide substrate is thin and flexible. Accordingly, the light-emitting structure may be formed on a rigid glass substrate. As a result, the polyimide substrate may function as the substrate 1110 after the removal of the glass substrate. As the display panel includes the light-emitting region A and the non-light-emitting region B, the substrate 1110 may also include the light-emitting region A and the non-light-emitting region B.

The buffer layer 1115 may be disposed on the substrate 1110. The buffer layer 1115 may extend from the light-emitting region A into the non-light-emitting region B. The buffer layer 1115 may prevent the diffusion (e.g., an out gassing) of metal atoms and/or impurities from the substrate 1110. For example, the buffer layer 1115 may prevent the permeation of an impure element. Additionally, the buffer layer 1115 may control a rate of a heat transfer in a crystallization process for forming the active pattern 1130, thereby obtaining a substantially uniform active pattern 1130. Furthermore, the buffer layer 1115 may flatten a surface of the substrate 1110 when the surface of the substrate 1110 is relatively irregular. According to the type of substrate 1110, at least two buffer layers may be disposed on the substrate 1110, or the buffer layer might not be disposed on the substrate 1110.

The switching element 1250 may include the active pattern 1130, the gate electrode 1170, the source electrode 1210, and the drain electrode 1230. The active pattern 1130 may be disposed on the substrate 1110. For example, the active pattern 1130 may be disposed on the buffer layer 1115. The active pattern 1130 may include an oxide semiconductor, an inorganic semiconductor (e.g., amorphous silicon, polysilicon, etc.), an organic semiconductor, etc.

The first insulation layer 1150 may be disposed on the active pattern 1130. Accordingly, the first insulation layer 1150 may cover the active pattern 1130 in the light-emitting region A, and may extend in a first direction (e.g., the x-axis direction) on the substrate 1110. For example, the first insulation layer 1150 may be disposed on the entire substrate

1110. For example, the first insulation layer 1150 may be disposed on the buffer layer 1115. The first insulation layer 1150 may include a silicon compound, a metal oxide, etc.

The gate electrode 1170 may be disposed on a portion of the first insulation layer 1150 under which the active pattern 1130 is disposed. For example, the first insulation layer 1150 is disposed between the gate electrode 1170 and the active pattern 1130. The gate electrode 1170 may include, for example, a metal, an alloy, metal nitride, conductive metal oxide, transparent conductive materials, etc. The second insulation layer 1190 may be disposed on the gate electrode 1170. Accordingly, the second insulation layer 1190 may cover the gate electrode 1170 in the light-emitting region A, and may extend in the first direction (e.g., the x-axis direction) on the substrate 1110. For example, the second insulation layer 1190 may be disposed on the entire substrate 1110. The second insulation layer 1190 may include a silicon compound, a metal oxide, etc.

The source electrode 1210 and the drain electrode 1230 may be disposed on the second insulation layer 1190. The source electrode 1210 may be in contact with a first side of the active pattern 1130 by removing a portion of the first and second insulation layers 1150 and 1190. For example, another contact hole may be formed so that the source electrode 1210 may contact the first side of the active pattern 1130. The drain electrode 1230 may be in contact with a second side of the active pattern 1130 by removing a second portion of the first and second insulation layers 1150 and 1190. For example, another contact hole may be formed so that the drain electrode 1230 may contact the second side of the active pattern 1130. The source electrode 1210 and the drain electrode 1230 each may include, for example, a metal, an alloy, metal nitride, conductive metal oxide, transparent conductive materials, etc.

The third insulation layer 1270 may be disposed on the source electrode 1210 and the drain electrode 1230. Accordingly, the third insulation layer 1270 may cover the source electrode 1210 and the drain electrode 1230 in the light-emitting region A of the display panel, and may extend in the first direction (e.g., the x-axis direction) on the substrate 1110. For example, the third insulation layer 1270 may be disposed on the entire substrate 1110. For example, the third insulation layer 1270 may be disposed on the second insulation layer 1190. The third insulation layer 1270 may include, for example, a silicon compound, a metal oxide, etc.

The first electrode 1290 may be disposed on the third insulation layer 1270. The first electrode 1290 may be in contact with the drain electrode 1230 by removing a portion of the third insulation layer 1270. For example, a contact hole may be formed so that the first electrode 1290 may be in contact with the drain electrode 1230. In addition, the first electrode 1290 may be electrically connected to the switching element 1250. The first electrode 1290 may include, for example, a metal, an alloy, a metal nitride, a conductive metal oxide, transparent conductive materials, etc.

In the present exemplary embodiment of the present inventive concept, the gate electrode 1170 is disposed on top of the active pattern 1130. However, exemplary embodiments of the present inventive concept are not limited thereto. For example, the gate electrode 1170 may be disposed under the active pattern 1130.

The pixel defining layer 1310 may be disposed on the third insulation layer 1270 such that the first electrode 1290 is exposed. For example, a portion of the first electrode 1290 may be covered by the third insulation layer 1270. The pixel defining layer 1310 may include organic materials or inorganic materials. In this case, the light-emitting layer 1330 may be disposed on a portion of the first electrode 1290 that is exposed by the pixel defining layer 1310.

The light-emitting layer 1330 may be disposed on the exposed portion of the first electrode 1290. The light-emitting layer 1330 may include light-emitting materials capable of generating different colors of light (e.g., red, blue and green). However, exemplary embodiments of the present inventive concept are not limited thereto. For example, the light-emitting layer 1330 may stack light-emitting materials capable of generating different colors of light to emit a white color of light.

The second electrode 1340 may be disposed on the pixel defining layer 1310 and the light-emitting layer 1330. Accordingly, the second electrode 1340 may cover the pixel defining layer 1310 and the light-emitting layer 1330 in the light-emitting region A and the non-light-emitting region B, and the second electrode 1340 may extend in the first direction (e.g., the x-axis direction) on the substrate 1110. For example, the second electrode 1340 may be electrically connected to the first through third pixels. The second electrode 1340 may include, for example, a metal, an alloy, a metal nitride, a conductive metal oxide, a transparent conductive material, etc. These materials may be used alone or in a combination thereof. The substrate 1110 may be combined with a second substrate 1350 by using a sealing member. In addition, a filler may be disposed between the substrate 1110 and an upper substrate (e.g., the second substrate) disposed on the substrate 1110.

A power supply line 1400 is disposed in the peripheral area PA. The power supply line 1400 is disposed on the same layer as the source electrode 1210 and the drain electrode 1230. For example, the power supply line 1400 may be disposed on the second insulation layer 1190. The power supply line 1400 may include substantially the same material as the source electrode 1210 and the drain electrode 1230. The power supply line 1400 may include, for example, a metal, an alloy, a metal nitride, a conductive metal oxide, transparent conductive materials, etc.

The buffer area BA is provided between the display area DA and the peripheral area PA. A power connecting line 1410 is disposed in the buffer area BA.

The power connecting line 1410 may connect the switching element 1250 and the power supply line 1400 to one another. In addition, there may be a plurality of power connecting lines 1410. Each power connecting line 1410 may be spaced apart from one another. For example, a space between the power connecting lines may be a particular distance.

The power connecting line 1410 is disposed on the same layer as the source electrode 1210 and the drain electrode 1230. For example, the power connecting line 410 may be disposed on the second insulation layer 1190. The power connecting line 1410 may include substantially the same material as the source electrode 1210 and the drain electrode 1230. The power connecting line 1410 may include, for example, a metal, an alloy, a metal nitride, a conductive metal oxide, transparent conductive materials, etc.

The power connecting line 1410 may include a first connecting portion 1411 having a first width and a second connecting portion 1413 having a second width that is wider than the first width. However, exemplary embodiments of the present inventive concept are not limited thereto. For example, the power connecting line 1410 may be one of a variety of shapes, such as a polygonal shape.

When the power supply line 1400 is connected to the switching element 1250 without being connected to the switching element 1250 by the power connecting line 1410, and since a line density of the power supply line 1400 is relatively high and a line density of the switching element 1250 is relatively low, a difference in line density may occur. When the power supply line 1400 is formed, a lot of developer may be injected. Thus, lines of the switching element 1250 adjacent to the power supply line 1400 may be over developed due to the excessive amount of developer. Accordingly, patterning defects may occur in the display area DA adjacent to the power supply line 1400.

However, a display panel according to an exemplary embodiment of the present inventive concept may include the power connecting line 1410 that connects the power supply line 1400 and the switching element 1250. There may be a plurality of power connecting lines 1410, and adjacent the power connecting lines 1410 may be spaced apart from one another. For example, a line density of the power connecting line 1410 may be lower than a line density of the power supply line 1400. The power connecting lines 1410 may be disposed in the buffer area BA. Since the buffer area BA is disposed adjacent to the power supply line 1400 having high line density, patterning defects due to a difference in line density may occur at the power connecting line 1410 of the buffer area BA. Thus, patterning defects of lines in the display area DA may be decreased.

In addition, a dummy active pattern 1500 is disposed in the buffer area BA. The dummy active pattern 1500 overlaps the power connecting line 1410. For example, the dummy active pattern 1500 may be disposed below the power connecting line 1410. The dummy active pattern 1500 may be disposed on the same layer as the active pattern 1130 of the switching element 1250. For example, the dummy active pattern 1500 may be disposed on the first insulation layer 1150. The dummy active pattern 1500 may include substantially the same material as the active pattern 1130. For example, the dummy active pattern 1500 may include an oxide semiconductor, an inorganic semiconductor (e.g., amorphous silicon, polysilicon, etc.), an organic semiconductor, etc.

The dummy active pattern 1500 may include a first dummy pattern 1510 including a third width, and a second dummy pattern 1520 spaced apart from the first dummy pattern 1510 and including a fourth width that is greater than the third width. In addition, the lengths of the first dummy pattern 1510 and the second dummy pattern 1520 may be different from one another. For example, the length of the second dummy pattern 1520 may have a length greater than a length of the first dummy pattern 1510. The first dummy pattern 1510 overlaps the first connecting portion 1411, and the second dummy pattern 1520 overlaps the second connecting portion 1413.

When the power supply line 1400 is connected to the switching element 1250 without being connected to the switching element 1250 by the power connecting line 1410, and since a line density of the power supply line 1400 is relatively high and a line density of the switching element 1250 is relatively low, a difference in line density may occur. When the power supply line 1400 is formed, a lot of developer may be injected. Thus, lines of the switching element 1250 adjacent to the power supply line 1400 may be over developed due to the excessive amount of developer. Accordingly, patterning defects may occur in the display area DA adjacent to the power supply line 1400.

However, a display panel according to an exemplary embodiment of the present inventive concept includes the buffer area BA connecting the power supply line 1400 and the switching element 1250. The dummy active pattern 1500 is disposed in the buffer area BA. Since the buffer area BA is disposed adjacent to the power supply line 1400 having high line density, patterning defects due to a difference in line density may occur at the power connecting line 1410 in the buffer area BA. Thus, patterning defects of lines in the display area DA may be decreased.

FIGS. 10 to 13 are cross-sectional views illustrating a method of manufacturing the display panel of FIG. 9 according to an exemplary embodiment of the present inventive concept.

Figure 10:
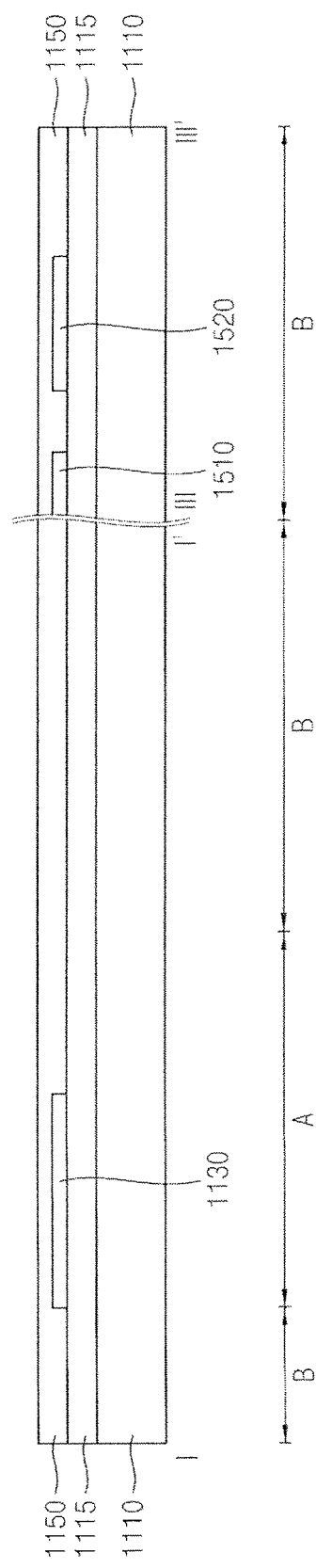
FIGS. 10, 11, 12 and 13 are cross-sectional views illustrating a method of manufacturing the display panel of FIG. 9 according to an exemplary embodiment of the present inventive concept.

Referring to FIG. 10, the buffer layer 1115 is formed on the substrate 1110. Further, the active pattern 1130 and the first insulation layer 1150 are formed on the buffer layer 1115.

The substrate 1110 may include, for example, quartz, synthetic quartz, calcium fluoride, fluoride-doping quartz, a sodalime glass, a non-alkali glass etc.

The substrate 1110 may include transparent materials. For example, the substrate 1110 may include quartz, synthetic quartz, calcium fluoride, fluoride-doping quartz, a sodalime glass, a non-alkali glass etc. In addition, the substrate may be flexible. For example, the substrate 1110 may include a flexible transparent resin substrate. Here, the flexible transparent resin substrate for the substrate 1110 may include a polyimide substrate. For example, the polyimide substrate may include a first polyimide layer, a barrier film layer, a second polyimide layer, etc. If the polyimide substrate is thin and flexible, the polyimide substrate may be formed on a rigid glass substrate to help support the light-emitting structure. In other words, the substrate 1110 may include a structure in which the first polyimide layer, the barrier film layer, and the second polyimide layer are stacked on a glass substrate. Here, after an insulation layer is disposed on the second polyimide layer, the light-emitting structure (e.g., the switching element 1250, a capacitor, the first electrode 1290, the light-emitting layer 1330, the second electrode 1340, etc.) may be disposed on the insulation layer.

After the light-emitting structure is formed on the insulation layer, the glass substrate may be removed. Forming the light-emitting structure directly on the polyimide substrate may be difficult because the polyimide substrate is thin and flexible. Accordingly, the light-emitting structure may be formed on a rigid glass substrate. As a result, the polyimide substrate may function as the substrate 1110 after the removal of the glass substrate. As the display panel includes the light-emitting region A and the non-light-emitting region B, the substrate 1110 may also include the light-emitting region A and the non-light-emitting region B.

The buffer layer 1115 may be disposed on the substrate 1110. The buffer layer 1115 may extend from the light-emitting region A into the non-light-emitting region B. The buffer layer 1115 may prevent the diffusion (e.g., an out gassing) of metal atoms and/or other impurities from the substrate 1110. For example, the buffer layer 1115 may prevent the permeation of an impure element. Additionally, the buffer layer 1115 may control a rate of a heat transfer in a crystallization process for forming the active pattern 1130, thereby obtaining a substantially uniform active pattern 1130. Furthermore, the buffer layer 1115 may flatten the surface of the substrate 1110 when a surface of the substrate 1110 is relatively irregular. According to the type of substrate 1110, at least two buffer layers may be disposed on the substrate 1110, or the buffer layer might not be disposed on the substrate 1110.

The active pattern 1130 may include an oxide semiconductor, an inorganic semiconductor (e.g., amorphous silicon, polysilicon, etc.), an organic semiconductor, etc.

The dummy active pattern 1500 may be disposed on the same layer as the active pattern 1130. For example, the dummy active pattern 1500 may be disposed on the first insulation layer 1150. The dummy active pattern 1500 may include substantially the same material as the active pattern 1130. For example, the dummy active pattern 1500 may include an oxide semiconductor, an inorganic semiconductor (e.g., amorphous silicon, polysilicon, etc.), an organic semiconductor, etc.

The first insulation layer 1150 may be disposed on the active pattern 1130 and the dummy active pattern 1500. Accordingly, the first insulation layer 1150 may cover the active pattern 1130 in the light-emitting region A, and may extend in the first direction (e.g., the x-axis direction) on the substrate 1110. For example, the first insulation layer 1150 may be disposed on the entire substrate 1110. For example, the first insulation layer 1150 may be disposed on the buffer layer 1115. The first insulation layer 1150 may include a silicon compound, a metal oxide, etc.

Figure 11:
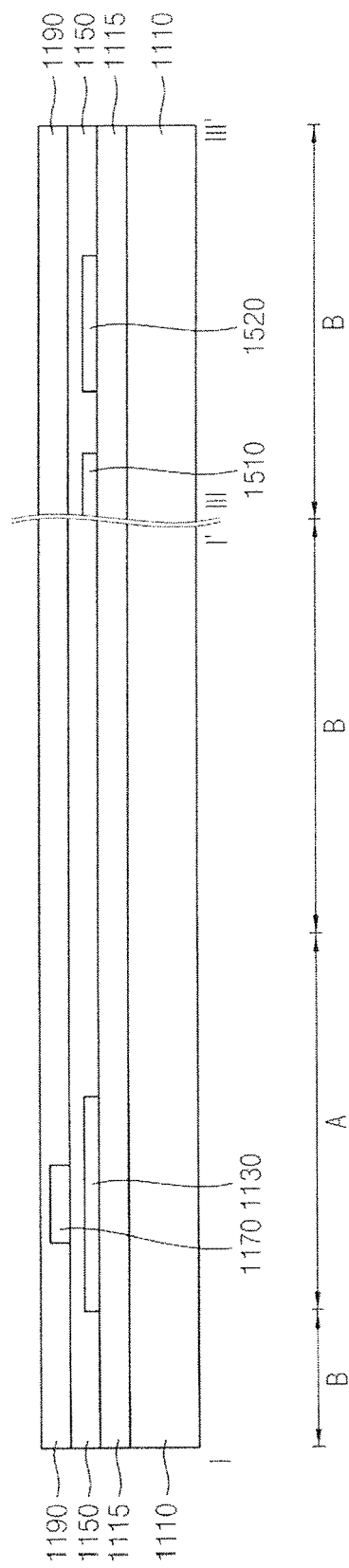

Referring to FIG. 11, the gate electrode 1170 and the second insulation layer 1190 are formed on the substrate 1110, which the first insulation layer 1150 is formed on.

The gate electrode 1170 may be disposed on a portion of the first insulation layer 1150 under which the active pattern 1130 is disposed. For example, the first insulation layer 1150 is disposed between the gate electrode 1170 and the active pattern 1130. The gate electrode 1170 may include a metal, an alloy, a metal nitride, a conductive metal oxide, transparent conductive materials, etc.

The second insulation layer 1190 may be disposed on the gate electrode 1170. Accordingly, the second insulation layer 1190 may cover the gate electrode 1170 in the light-emitting region A, and may extend in the first direction (e.g., the x-axis direction) on the substrate 1110. For example, the second insulation layer 1190 may extend in a horizontal direction. As an additional example, the second insulation layer 1190 may be disposed on the entire substrate 1110. The second insulation layer 1190 may include of a silicon compound, a metal oxide, etc.

Figure 12:
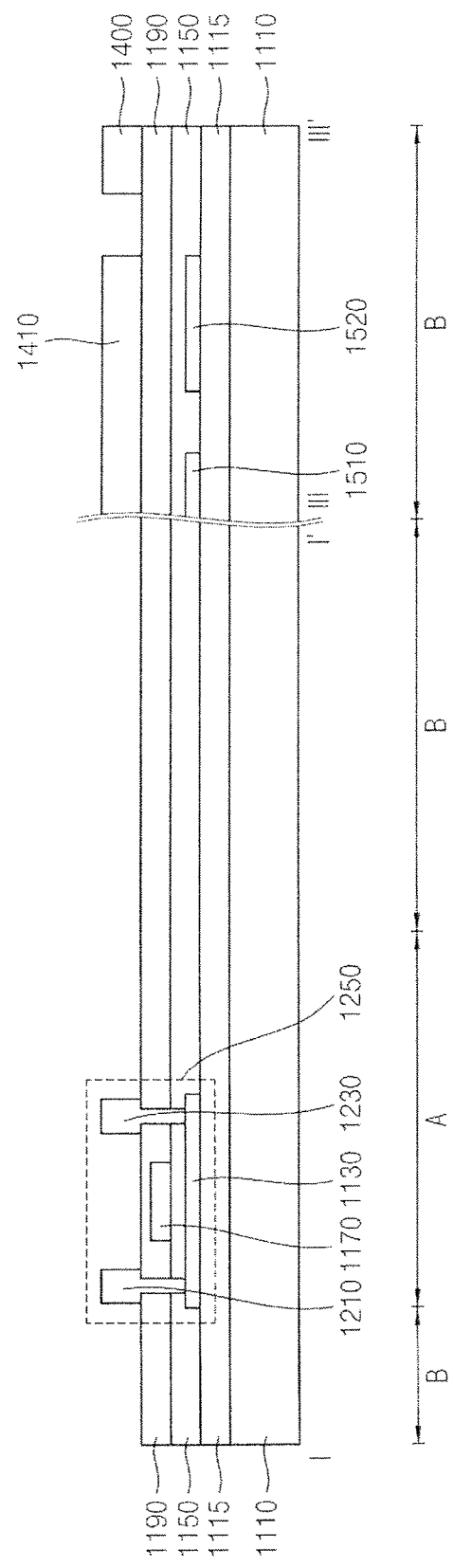

Referring to FIG. 12, the source electrode 1210, the drain electrode 1230, the power supply line 1400 and the power connecting line 1410 are formed on the substrate 1110, which the second insulation layer 1190 is formed on.

The source electrode 1210 and the drain electrode 1230 may be disposed on the second insulation layer 1190. The source electrode 1210 may be in contact with a first side of the active layer 1130 by removing a portion of the first and second insulation layers 1150 and 1190. For example, a contact hole may be formed so that the source electrode 1210 may contact the first side of the active pattern 1130. The drain electrode 1230 may be in contact with a second side of the active layer 1130 by removing a second portion of the first and second insulation layers 1150 and 1190. For example, another contact hole may be formed so that the drain electrode 1230 may contact the second side of the active pattern 1130. The source electrode 1210 and the drain electrode 1230 each may include, for example, a metal, an alloy, a metal nitride, a conductive metal oxide, transparent conductive materials, etc.

The power supply line 1400 is disposed on the same layer as the source electrode 1210 and the drain electrode 1230. For example, the power supply line 1400 may be disposed on the second insulation layer 1190. The power supply line 1400 may include substantially the same material as the source electrode 1210 and the drain electrode 1230. For example, the power supply line 1400 may include a metal, an alloy, a metal nitride, a conductive metal oxide, transparent conductive materials, etc.

The power connecting line 1410 is disposed on the same layer as the source electrode 1210 and the drain electrode 1230. For example, the power connecting line 1410 may be disposed on the second insulation layer 1190. The power connecting line 1410 may include substantially the same material as the source electrode 1210 and the drain electrode 1230. For example, the power connecting line 1410 may include a metal, an alloy, a metal nitride, a conductive metal oxide, transparent conductive materials, etc.

In an exemplary embodiment of the present inventive concept, the gate electrode 1170 is disposed on the active pattern 1130. For example, the gate electrode 1170 may be disposed on the first insulation layer 1150. However, exemplary embodiments of the present inventive concept are not limited thereto. For example, the gate electrode 1170 may overlap the active pattern 1130.

Figure 13:
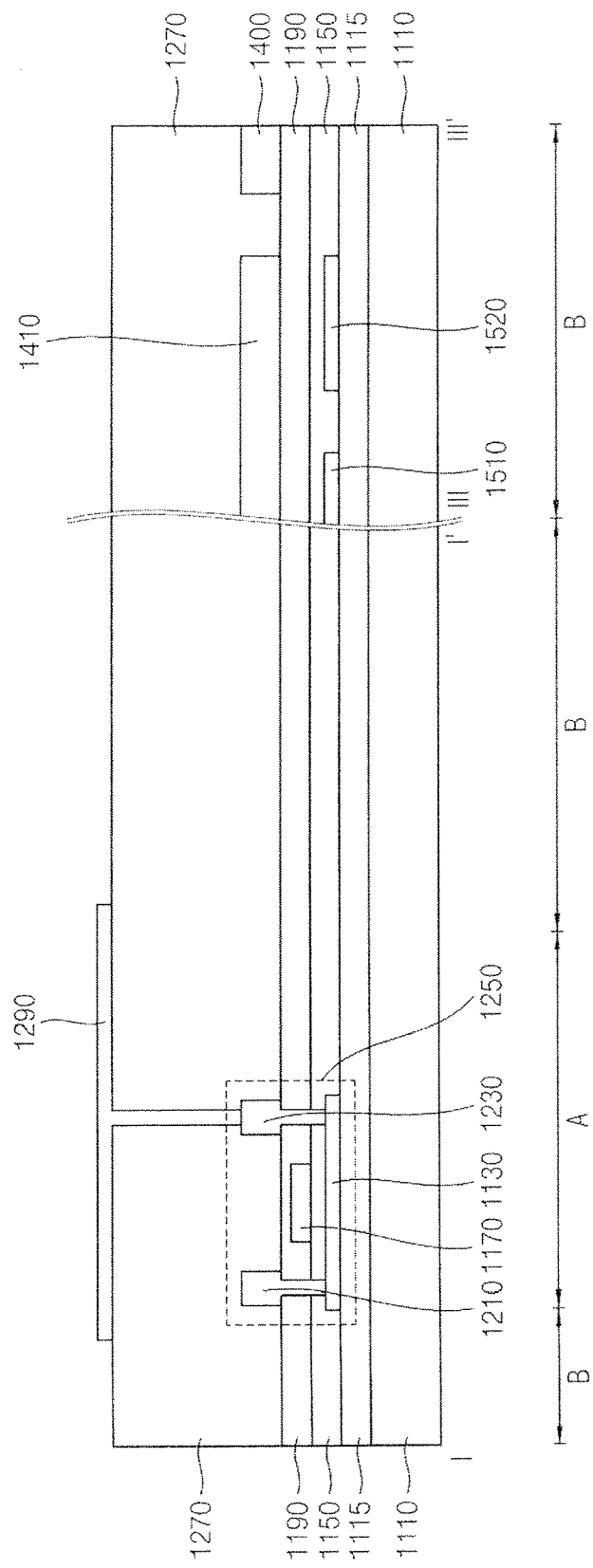

Referring to FIG. 13, the third insulation layer 1270 and the first electrode 1290 are formed on the substrate 1110. In addition, the source electrode 1210 and the drain electrode 1230 are formed on the substrate 1110.

The third insulation layer 1270 may be disposed on the second insulation layer 1190 and the source electrode 1210 and the drain electrode 1230. Accordingly, third insulation layer 1270 may cover the source electrode 1210 and the drain electrode 1230 in the light-emitting region A of the display panel, and may extend in the first direction (e.g., the x-axis direction) on the substrate 1110. For example, the third insulation layer 1270 may be disposed on the entire substrate 1110. For example, the third insulation layer 1270 may be disposed on the second insulation layer 1190. The third insulation layer 1270 may include, for example, a silicon compound, a metal oxide, etc.

The first electrode 1290 may be disposed on the third insulation layer 1270. The first electrode 1290 may be in contact with the source electrode 1210 by removing a portion of the third insulation layer 1270. For example, a contact hole may be formed so that the first electrode 1290 may be in contact with the source electrode 1210. In addition, the first electrode 1290 may be electrically connected to the switching element 1250. The first electrode 1290 may include, for example, a metal, an alloy, a metal nitride, a conductive metal oxide, transparent conductive materials, etc.

Referring to FIG. 9, the pixel defining layer 1310, the light-emitting layer 1330 and the second electrode 1340 are formed on the substrate 1110. In addition, the first electrode 1290 is formed on the substrate 1110.

The pixel defining layer 1310 may be disposed on the third insulation layer 1270 such that the first electrode 1290 is exposed. For example, a portion of the first electrode 1290 may be covered by the pixel defining layer 1310. The pixel defining layer 1310 may include organic materials or inorganic materials. In this case, the light-emitting layer 1330 may be disposed on a portion of the first electrode 1290 that is exposed by the pixel defining layer 1310.

The light-emitting layer 1330 may be disposed on the exposed portion of the first electrode 1290. The light-emitting layer 1330 may include light-emitting materials capable of generating different colors of light (e.g., red, blue, and green). However, exemplary embodiments of the present inventive concept are not limited thereto. For example, the light-emitting layer 1330 may stack light-emitting materials capable of generating different colors of light to emit a white color of light.

The second electrode 1340 may be disposed on the pixel defining layer 1310 and the light-emitting layer 1330. Accordingly, the second electrode 1340 may cover the pixel defining layer 1310 and the light-emitting layer 1330 in the light-emitting region A and the non-light-emitting region B, and the second electrode 1340 may extend in the first direction (e.g., the x-axis direction) on the substrate 1110. For example, the second electrode 1340 may be electrically connected to the first through third pixels. The second electrode 1340 may include, for example, a metal, an alloy, a metal nitride, a conductive metal oxide, a transparent conductive material, etc. These materials may be used alone or in a combination thereof.

According to an exemplary embodiment of the present inventive concept, a display panel includes the power connecting line 1410 that connects the power supply line 1400 and the switching element 1250. There may be a plurality of power connecting lines 1410, and adjacent power connecting lines 1410 may be spaced apart from one another. For example, a line density of the power connecting line 1410 may be lower than a line density of the power supply line 1400. The power connecting lines 1410 may be disposed in the buffer area BA. Since the buffer area BA is disposed adjacent to the power supply line 1400 having a high line density, patterning defects due to a difference in line density may occur at the power connecting line 1410 of the buffer area BA. Thus, patterning defects of lines in the display area DA may decrease.

In addition, a display panel includes the buffer area BA where the power supply line 1400 and the switching element 1250 are connected to one another. The dummy active pattern 1500 is disposed in the buffer area BA. Since the buffer area is disposed adjacent to the power supply line 1400 having a high line density, patterning defects due to a difference in line density may occur at the power connecting line 1410 in the buffer area BA. Thus, patterning defects of lines in the display area DA may decrease.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A display panel comprising:
   a substrate comprising a display area, a peripheral area and a buffer area disposed between the display area and the peripheral area;
   a switching element disposed in the display area and comprising:
   an active pattern;
   a gate electrode overlapping the active pattern;
   a source electrode connecting with the active pattern; and
   a drain electrode spaced apart from the source electrode;
   a power supply line disposed in the peripheral area and disposed on a same layer as the source electrode and the drain electrode;
   a power connecting line disposed in the buffer area and connecting the switching element to the power supply line; and
   a dummy active pattern disposed in the buffer area and overlapping the power connecting line.

2. The display panel of claim 1, further comprising a plurality of power connecting lines, and each power connecting line is spaced apart from an adjacent power connecting line.

3. The display panel of claim 1, wherein the power connecting line is disposed on a same layer as the source electrode and the drain electrode.

4. The display panel of claim 1, wherein the dummy active pattern is disposed on a same layer as the active pattern.

5. The display panel of claim 1, wherein the power connecting line comprises:
   a first connecting portion having a first width; and
   a second connecting portion having a second width that is greater than the first width.

6. The display panel of claim 5, wherein the dummy active pattern comprises:
   a first dummy portion overlapping the first connecting portion; and
   a second dummy portion overlapping the second connecting portion.

7. A display panel comprising:
   a substrate including a display area, a peripheral area, and a buffer area disposed between the display area and the peripheral area;
   a switching dement disposed in the display area;
   a power supply line disposed in the peripheral area;
   a power connecting line connecting the switching element and the power supply line to one another, wherein the power connecting line includes a first connecting portion having a first total area and a second connecting portion having a second total area that is greater than the first total area; and
   a dummy active pattern disposed in the buffer area.

8. The display panel of claim 7, wherein the dummy active pattern overlaps the power connecting line, and comprises a first dummy portion having a third area greater than the first total area and a second dummy portion having a fourth area greater than the second total area.

9. The display panel of claim 8, wherein the first dummy portion is overlapped by the first connecting portion, and the second dummy portion is overlapped by the second connecting portion.

10. A display panel comprising:
    a substrate including a display area and a peripheral area;
    a switching element disposed in the display area;
    a power supply line disposed in the peripheral area; and
    a power connecting line connecting the switching element and the power supply line to one another, wherein the power connecting line includes a first connecting portion having a first total area and a second connecting portion having a second total area that is greater than the first total area, wherein the substrate includes a buffer area between the display area and the peripheral area, and the power connecting line is disposed in the buffer area.

11. The display panel of claim 7, wherein the power supply line is disposed adjacent to the power connecting line.

12. The display panel of claim 7, wherein the power connecting line is disposed in the buffer area.

13. The display panel of claim 7, wherein a line density of the power connecting line is less than a line density of the power supply line.

14. The display panel of claim 7, wherein the power supply line is disposed adjacent to the buffer area.

* * * * *